US008193826B2

(12) United States Patent
Lee

(10) Patent No.: US 8,193,826 B2
(45) Date of Patent: Jun. 5, 2012

(54) AUTO PROBE DEVICE AND METHOD OF TESTING LIQUID CRYSTAL PANEL USING THE SAME

(75) Inventor: Eun Jung Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 254 days.

(21) Appl. No.: 12/588,164

(22) Filed: Oct. 6, 2009

(65) Prior Publication Data

US 2010/0109693 A1 May 6, 2010

(30) Foreign Application Priority Data

Oct. 30, 2008 (KR) ........................ 10-2008-0107379

(51) Int. Cl.
*G01R 31/26* (2006.01)
*G01R 31/20* (2006.01)

(52) U.S. Cl. .............................. 324/760.01; 324/754.01

(58) Field of Classification Search .................. 324/120, 324/755.01–755.11, 760.01–760.02, 762.01–762.09, 324/763.01, 754.01–754.3; 438/14–18; 257/48; 349/12, 192, 40, 149, 152
See application file for complete search history.

(56) References Cited

U.S. PATENT DOCUMENTS 5,546,013 A * 8/1996 Ichioka et al. ........... 324/760.02
6,603,467 B1 * 8/2003 Wu .............................. 345/204
6,839,121 B2 * 1/2005 Kim et al. ..................... 349/152
7,852,423 B2 * 12/2010 Park ................................ 349/58

* cited by examiner

*Primary Examiner* — Roberto Velez
*Assistant Examiner* — Tung X Nguyen
(74) *Attorney, Agent, or Firm* — McKenna Long & Aldridge LLP

(57) ABSTRACT

An auto probe device used in a method of testing a plurality of signal lines of a liquid crystal panel includes a printed circuit board having a shorting bar, a flexible printed circuit board having a plurality of connection patterns electrically connected to the shorting bar of the printed circuit board, and a plurality of contact pins contacting the plurality of pads formed in a non-display area of the liquid crystal panel. Such an auto probe device reduces a defect generation rate in a lighting test of the liquid crystal panel so that accuracy of the lighting test may be improved.

5 Claims, 3 Drawing Sheets

AUTO PROBE DEVICE AND METHOD OF TESTING LIQUID CRYSTAL PANEL USING THE SAME

CROSS-REFERENCE TO RELATED APPLICATION

This application claims priority under 35 U.S.C. 119 to Korean Patent Application No. 10-2008-0107379, filed on Oct. 30, 2008, which is hereby incorporated by reference in its entirety for all purposes as if fully set forth herein.

BACKGROUND

1. Field of the Disclosure

This disclosure relates to an auto probe device, and more particularly, to an auto probe device which can reduce a defect generation rate in the lighting test of a liquid crystal panel while improving accuracy, and a method of testing a liquid crystal panel using the auto probe device.

2. Description of the Related Art

Liquid crystal display (LCD) devices are quickly replacing cathode ray tubes (CRTs) in many applied fields because the LCD devices can be made compact and mass productivity thereof may be improved. In particular, the LCD device of an active matrix type driving liquid crystal cells using thin film transistors (TFTs) exhibits a superior image quality and low power consumption. With recently developed mass-production technologies, the LCD devices having large screens and high resolutions are rapidly developed.

A process to manufacture active matrix type LCD devices includes substrate cleaning process, a substrate patterning process, an orientation layer forming/rubbing process, a substrate combining/liquid crystal injection process, a mounting process, a test process, and a repair process.

The test process includes an electric lighting test and a pixel defect test which are performed after a variety of signal lines and pixel electrodes are formed in the liquid crystal panel. In the process of testing a liquid crystal panel, a lighting test using an auto probe device is performed for a test to check the existence of a point defect and a breaking down of the signal lines in the liquid crystal panel.

The auto-probe device includes a gate pad formed on the liquid crystal panel to test a defect of the signal lines of the liquid crystal panel, a main body for applying a signal to a data pad and a common electrode pad, and a plurality of needles connected to the main body and directly contacting the gate pad, the data pad, and the common electrode pad.

The defect test of a liquid crystal panel is performed by allowing the needles of the auto-probe device to have one-to-one contacts with the pads, that is, the gate pads, the data pads, and the common electrode pads, formed on the liquid crystal panel. Since allowing the pads of the liquid crystal panel to have one-to-one contacts with the needles of the auto probe device is not easy, contact miss may be generated during the contact process.

To address the above matter, there is a method in which a shorting bar connected to a plurality of pads is provided in a non-display area of the liquid crystal panel to allow the shorting bar and the needles of the auto probe device to have one-to-one contact with each other. In this case, the contact miss may be reduced when the shorting bar contacts the needles of the auto probe device, compared to the above-described method. However, when a part of the non-display area of the liquid crystal panel where the shorting bar is formed is torn off, signals may not be applied to the signal lines of the liquid crystal panel so that a test defect may be generated.

BRIEF SUMMARY

Accordingly, the present embodiments are directed to an auto prove device that substantially obviates one or more of problems due to the limitations and disadvantages of the related art.

An object of the embodiment of the present disclosure is to provide an auto probe device which can perform a lighting test by stably applying a signal to signal lines of a liquid crystal panel even when pin contact defect exists and an edge portion of the liquid crystal panel is torn off, and a method of testing a liquid crystal panel using the auto probe device.

Another object of the embodiment of the present disclosure is to provided an auto probe device which can reduce a defect generation rate in a lighting test of the liquid crystal panel so that accuracy of the lighting test may be improved, and a method of testing a liquid crystal panel using the auto probe device.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an auto probe device used in a method of testing a plurality of signal lines of a liquid crystal panel, the liquid crystal panel being divided into a display area in which the plurality of signal lines are formed and a non-display area in which a plurality of pads correspondingly connected to the plurality of signal lines and a first shorting bar electrically connected to the plurality of pads are formed, comprises a flexible printed circuit board having a plurality of connection patterns electrically one-to-one connected to the plurality of pads, overlapping the non-display area of the liquid crystal panel, and attached to a side surface of the liquid crystal panel, a printed circuit board on which a second shorting bar electrically connected to the plurality of connection patterns of the flexible printed circuit board is formed, and a plurality of contact pins contacting a portion where the plurality of pads and the plurality of connection patterns are connected to each other and supplying a signal to the plurality of signal lines of the liquid crystal panel.

According to another general aspect of the present embodiment, a method of testing a liquid crystal panel using an auto probe device comprises providing the liquid crystal panel divided into a display area in which a plurality of signal lines are formed and a non-display area in which a plurality of pads correspondingly connected to the plurality of signal lines and a first shorting bar electrically connected to the plurality of pads are formed, providing the auto probe device comprising a flexible printed circuit board having a plurality of connection patterns electrically one-to-one connected to the plurality of pads, overlapping the non-display area of the liquid crystal panel, and attached to a side surface of the liquid crystal panel, a printed circuit board on which a second shorting bar electrically connected to the plurality of connection patterns of the flexible printed circuit board is formed, and a plurality of contact pins contacting a portion where the plurality of pads and the plurality of connection patterns are connected to each other and supplying a signal to the plurality of signal lines of the liquid crystal panel, and connecting the plurality of connection patterns of the auto probe device to the plurality of pads of the liquid crystal panel, and simultaneously, allowing the plurality of contact pins of the auto probe device to contact a portion where the plurality of pads and the plurality of connection patterns are connected to each other.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
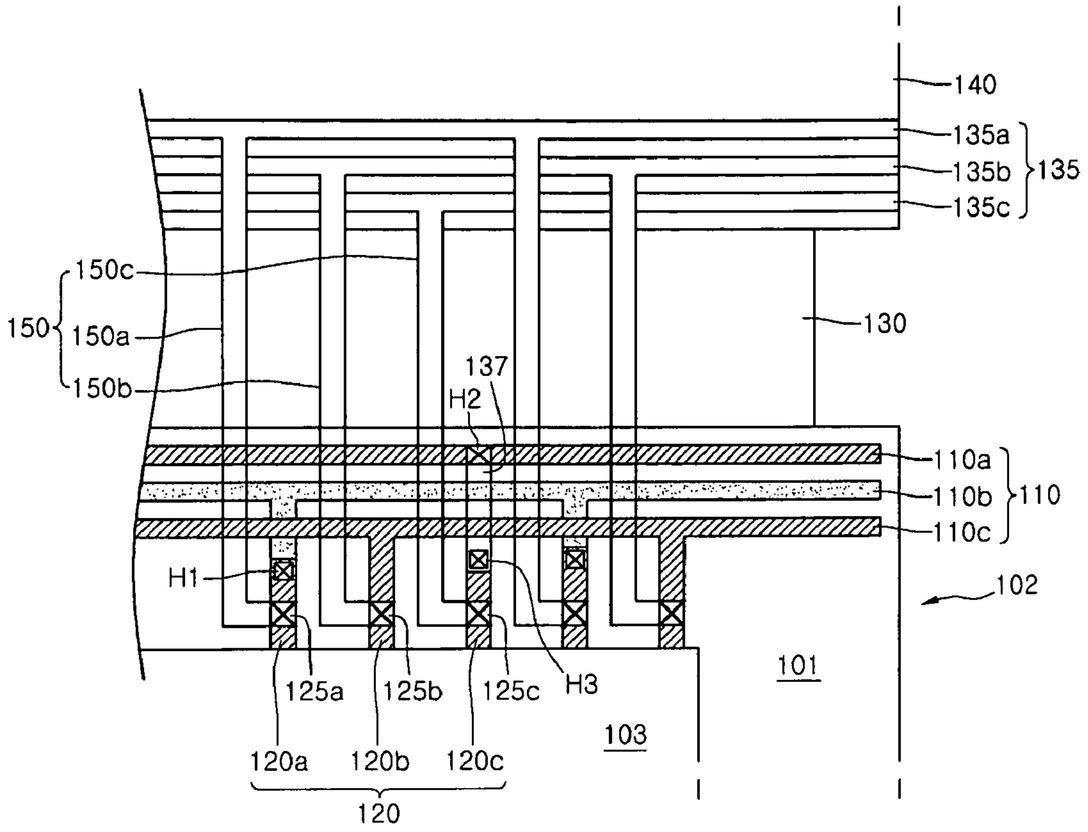
FIG. 1 is a view showing part of a liquid crystal panel subject to a lighting test using an auto probe device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 illustrates part of a liquid crystal panel 102 subject to a lighting test using an auto probe device according to an embodiment of the present disclosure. Referring to FIG. 1, the liquid crystal panel 102 is formed by combining an upper substrate or a color filter array substrate, and a lower substrate or a thin film transistor (TFT) array substrate, and is divided into a display area 103 where a plurality of liquid crystal cells are arranged in a matrix and a non-display area 101 that is an area of the liquid crystal panel 102 except for the display area 103.

A gate pad (not shown) extending from a gate line of the display area 103, a data pad 120 extending from a data line of the display area 103, and a panel shorting bar 110 electrically connected to the data pad 120 are formed in the non-display area 101.

In the display area 103 of the liquid crystal panel 102, the upper substrate includes a color filter for embodying colors, a black matrix for preventing light leakage, and a common electrode forming an electric filed with a pixel electrode. The lower substrate includes a plurality of data lines for supplying a data signal from the data pad 120, a plurality of gate lines for supplying a gate signal from the gate pad, a TFT for switching a liquid crystal cell at a position where the data line and the gate line cross each other, and a pixel electrode connected to the TFT to drive the liquid crystal cell.

The panel shorting bar 110 is used for a lighting test of signal lines of the liquid crystal panel 102. The panel shorting bar 110 includes first through third panel shorting lines 110*a*-110*c* formed of a conductive metal. The second panel shorting line 110*b* of the first through third panel shorting lines 110*a*-110*c* is formed, simultaneously with the gate line, of the same material as one used for the gate line of the display area 103. The second panel shorting line 110*b* is connected to a first data pad 120*a* of the data pad 120 via a first contact hole H1 penetrating an insulation layer (not shown). A plurality of second data pads 120*b* are commonly connected to the third panel shorting lines 110*c* and may be formed of the same material used for the data line and the data pad 120.

The first panel shorting line 110*a* is connected to a third data pad 120*c* via a transparent conductive pattern 137. That is, the transparent conductive pattern 137 is connected to the first panel shorting line 110*a* via a second contact hole H2 that penetrates a protection layer (not shown) to expose the first panel shorting line 110*a*, and simultaneously, to the third data pad 120*c* via a third contact hole H3 that penetrates the protection layer to expose the third data pad 120*c*.

A lighting test for testing the existence of short-circuit of signal lines of the liquid crystal panel 102 is performed after the signal lines including the gate line and the data line are formed in the display area 103 of the liquid crystal panel 102 and the gate pad connected to the gate line, the data pad 120 connected to the data line, and the panel shorting bar 110 are formed in the non-display area 101 of the liquid crystal panel 102. Not only the panel shorting bar 110 electrically connected to the data pad 120 but also a shorting bar (not shown) electrically connected to the gate pad may be further formed in the non-display area of the liquid crystal panel 102.

Figure 2:
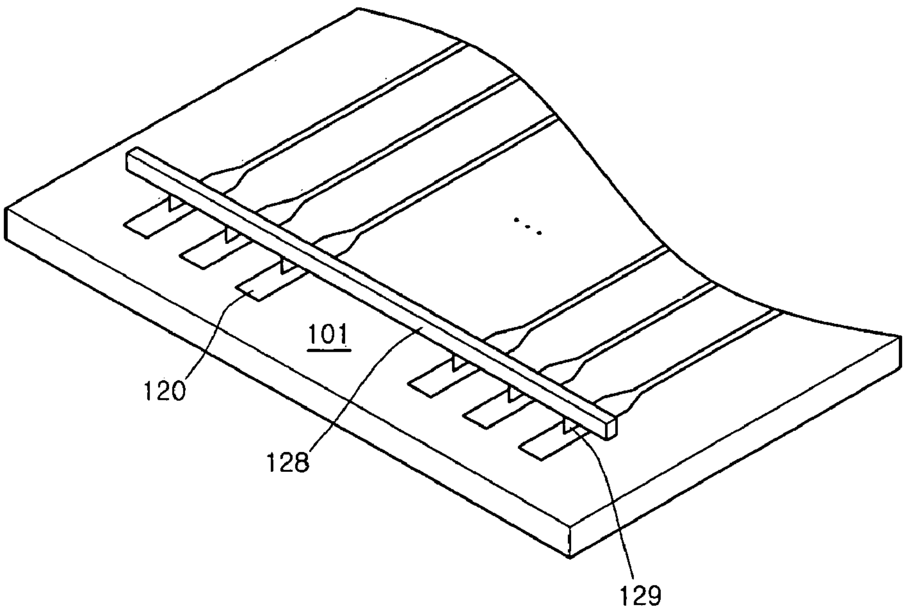
FIG. 2 is a view illustrating a process for a lighting test of signal lines of a liquid crystal panel using the auto probe device of FIG. 1.

A lighting test of the liquid crystal panel 102 is performed using an auto probe device. The auto probe device includes a flexible cable (FPC) 130 attached to a side surface of the liquid crystal panel 102 and a printed circuit board (PCB) 140 electrically connected to the FPC 130. Also, the auto probe device, as shown in FIG. 2, further includes a plurality of contact pins 129 used for determining the existence of signal application by directly contacting the data pd 120 formed in the non-display area 101 of the liquid crystal panel 102 and a main bar 128 connected to the contact pins 129.

A PCB shorting bar 135 including first through third PCB shorting lines 135*a*-135*c* formed of conductive metal is formed on the PCB 140. The PCB shorting bar 135 may be formed of the same metal as one used for the panel shorting bar 110 formed in the non-display area 101 of the liquid crystal panel 102.

A plurality of connection patterns 150 electrically connected to the PCB shorting bar 135 formed on the PCB 140 are formed on the FPC 130. The connection patterns 150 include a first connection pattern 150*a* electrically connected to the first PCB shorting line 135*a*, a second connection pattern 150*b* electrically connected to the second PCB shorting line 135*b*, and a third connection pattern 150*c* electrically connected to the third PCB shorting line 135*c*. The FPC 130 may be attached to the side surface of the PCB 140. The number of the connection patterns 150 formed on the FPC 130 is the same as that of the data pad 120 of the liquid crystal panel 102.

The auto probe device is connected to the liquid crystal panel 102 to determine the lighting of the signal lines (the gate line and the data line) of the liquid crystal panel 102. The FPC 130 is attached to the side surface of the liquid crystal panel 102 when the lighting of the signal lines (the gate line and the data line) of the liquid crystal panel 102 is tested using the auto probe device.

In detail, the connection patterns 150 of the FPC 130 are electrically connected to the data pad 120 formed in the non-display area 101 of the liquid crystal panel 102. The first connection pattern 150*a* of the FPC 130 is electrically connected to the first data pad 120*a* in the non-display area 101 via a first pad contact hole 125*a*. The second connection pattern 150*b* of the FPC 130 is electrically connected to the second data pad 120*b* in the non-display area 101 via a second pad contact hole 125*b*. The third connection pattern 150*c* of the FPC 130 is electrically connected to the third data pad 120*c* in the non-display area 101 via a third pad contact hole 125*c*.

Consequently, in the lighting test of the signal lines (the gate line and the data line) of the liquid crystal panel 102, the other surface of the FPC 130 attached to the side surface of the PCB 140 contacts the side surface of the liquid crystal panel 102 so that the connection patterns 150 of the FPC 130 may be electrically connected to the data pad 120 of the liquid crystal panel 102 via the pad contact holes 125*a*-125*c*.

When a signal is supplied through the PCB shorting bar 135 formed on the PCB 140, the signal is supplied to the data pad 120 of the liquid crystal panel 102 via the connection patterns 150 electrically connected to the PCB shorting bar 135. Next, the contact pins 129 of FIG. 2 contact the data pad 120 of the liquid crystal panel 102 so that the lighting test of the signal lines (the gate line and the data line) of the liquid crystal panel 102 is performed.

The data pad 120 of the liquid crystal panel 102 is electrically connected to the panel shorting bar 110 formed in the non-display area 101 of the liquid crystal panel 102 and to the connection patterns 150 of the FPC 130. The FPC 130 is electrically connected to the PCB shorting bar 140 of the PCB 140.

Figure 3A:
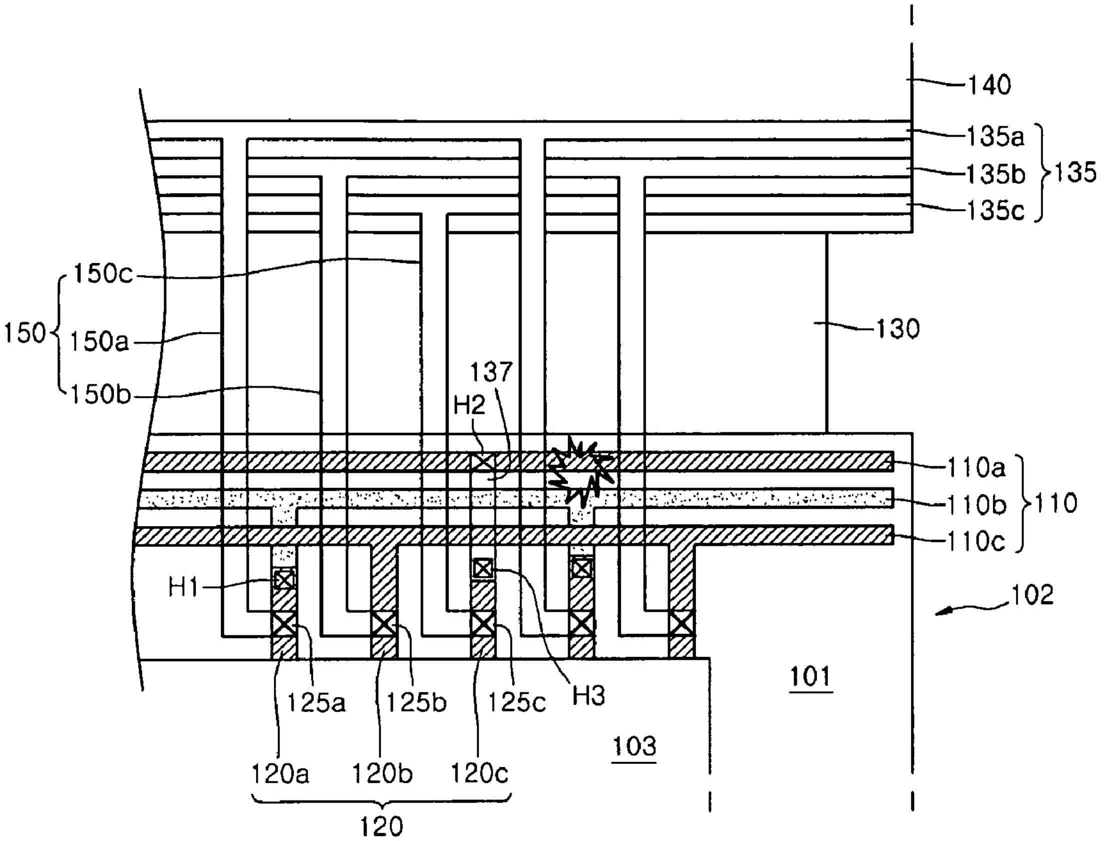
FIGS. 3A and 3B are views showing examples of defects that may be generated when the auto probe device contacts the liquid crystal panel.
Figure 3B:
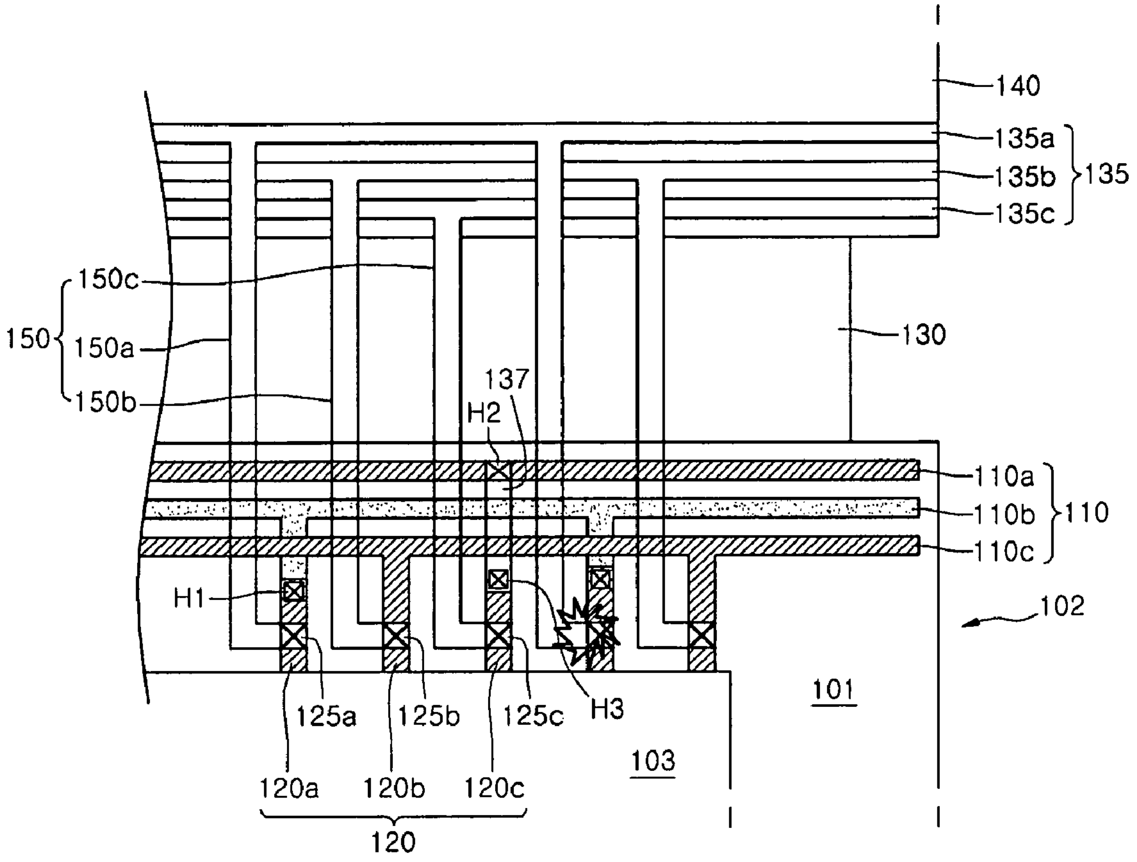

FIGS. 3A and 3B illustrate examples of defects that may be generated when the auto probe device contacts the liquid crystal panel. Referring to FIG. 3A, when the edge portion of the non-display area 101 of the liquid crystal panel 102 is torn off so that the panel shorting bar 110 formed in the non-display area 101 of the liquid crystal panel 102 may be damaged, the data pad 120 of the liquid crystal panel 102 that is electrically connected to the connection patterns 150 of the FPC 130 is not affected by this defect.

That is, even when the panel shorting bar 110 of the liquid crystal panel 102 electrically connected to the data pad 120 of the liquid crystal panel 102 is damaged, since the data pad 120 is connected to the connection patterns 150 so that signals are directly applied to the data pad 120 via the connection patterns 150, the lighting test of the signal lines (the gate line and the data line) of the liquid crystal panel 102 may be performed.

Referring to FIG. 3B, when contact miss is generated in the process of electrically connecting the connection patterns 150 of the FPC 130 and the data pad 120 of the liquid crystal panel 102 so that the data pad 120 may fail to receive a signal from the connection patterns 150, since the data pad 120 is electrically connected to the panel shorting bar 110 of the liquid crystal panel 102, the data pad 120 may receive the signal from the panel shorting bar 110.

That is, even when contact miss is generated between the connection patterns 150 and the data pad 120, since the data pad 120 is electrically connected to the panel shorting bar 110 of the liquid crystal panel 102 so as to receive a signal from the panel shorting bar 110, the lighting test of the signal lines (the gate line and the data line) of the liquid crystal panel 102 may be performed.

Accordingly, even when the panel shorting bar 110 formed in the non-display area 101 of the liquid crystal panel 102 is torn off due to a defect in the manufacturing process or contact miss is generated between the data pad 120 and the connection patterns 150 of the FPC 130 of the auto probe device, since a signal is input to the data pad 120, the lighting test of the signal lines (the gate line and the data line) of the liquid crystal panel 102 may be performed.

As a result, when the lighting test of the signal lines (the gate line and the data line) of the liquid crystal panel 102 is performed using the auto probe device according to the present embodiment, even when a defect is generated in the non-display area 101 of the liquid crystal panel 102, a defect generation rate in the lighting test of the signal lines (the gate line and the data line) may be reduced. Also, when the lighting test of the signal lines (the gate line and the data line) of the liquid crystal panel 102 is performed using the auto probe device according to the present embodiment, accuracy of the lighting test may be improved.

As described above, according to the present disclosure, since a shorting bar is formed on a PCB connected to a side surface of a liquid crystal panel via an FPC and a plurality of connection patterns electrically connected to the shorting bar are formed on the FPC, the connection patterns of the FPC and the pads formed on the liquid crystal panel are directly connected to each other. Thus, contact miss may be prevented and accuracy of a lighting test of the liquid crystal panel may be prevented.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. An auto probe device used in a method of testing a plurality of signal lines of a liquid crystal panel, the liquid crystal panel being divided into a display area in which the plurality of signal lines are formed and a non-display area in which a plurality of pads correspondingly connected to the plurality of signal lines and a first shorting bar electrically connected to the plurality of pads are formed, the auto probe device comprising:

a flexible printed circuit board having a plurality of connection patterns electrically one-to-one connected to the plurality of pads, overlapping the non-display area of the liquid crystal panel, and attached to a side surface of the liquid crystal panel;

a printed circuit board on which a second shorting bar electrically connected to the plurality of connection patterns of the flexible printed circuit board is formed; and a plurality of contact pins contacting a portion where the plurality of pads and the plurality of connection patterns are connected to each other and supplying a signal to the plurality of signal lines of the liquid crystal panel, wherein one side of the plurality of pads of the liquid crystal panel is connected to the first shorting bar of the liquid crystal panel via a first contact hole, the other side of the plurality of pads is one-to-one connected to one side of the plurality of connection patterns formed on the flexible printed circuit board via a second contact hole, wherein the second shorting bar is formed of the same material used for the plurality of the connection patterns.

2. The auto probe device claimed as claim 1, wherein the second shorting bar of the printed circuit board is formed in at least one conductive metal lines across an overall surface of the printed circuit board.

3. The auto probe device claimed as claim 1, wherein the number of the plurality of connection patterns formed on the flexible printed circuit board is the same as the number of the plurality of pads of the liquid crystal panel.

4. The auto probe device claimed as claim 1, wherein the other side of the plurality of connection patterns is connected to the second shorting bar of the printed circuit board.

5. A method of testing a liquid crystal panel using an auto probe device, the method comprising:

providing the liquid crystal panel divided into a display area in which a plurality of signal lines are formed and a non-display area in which a plurality of pads correspondingly connected to the plurality of signal lines and a first shorting bar electrically connected to the plurality of pads are formed;

providing the auto probe device comprising a flexible printed circuit board having a plurality of connection patterns electrically one-to-one connected to the plurality of pads, overlapping the non-display area of the liquid crystal panel, and attached to a side surface of the liquid crystal panel, a printed circuit board on which a second shorting bar electrically connected to the plurality of connection patterns of the flexible printed circuit board is formed, and a plurality of contact pins contacting a portion where the plurality of pads and the plurality of connection patterns are connected to each other and supplying a signal to the plurality of signal lines of the liquid crystal panel; and connecting the plurality of connection patterns of the auto probe device to the plurality of pads of the liquid crystal panel, and simultaneously, allowing the plurality of contact pins of the auto probe device to contact a portion where the plurality of pads and the plurality of connection patterns are connected to each other, wherein one side of the plurality of pads of the liquid crystal panel is connected to the first shorting bar of the liquid crystal panel via a first contact hole, the other side of the plurality of pads is one-to-one connected to one side of the plurality of connection patterns formed on the flexible printed circuit board via a second contact hole, wherein the second shorting bar is formed of the same material used for the plurality of the connection patterns.

* * * * *